United States Patent [19]

Nagatomo et al.

[11] 4,282,825
[45] Aug. 11, 1981

[54] SURFACE TREATMENT DEVICE

[75] Inventors: Hiroto Nagatomo, Hinode; Tetsuya Takagaki, Kodaira; Hisao Seki, Hamura; Shirou Terasaki, Kokubunjii; Hitoshi Horimuki, Kofu, all of Japan

[73] Assignee: Hitachi, Ltd., Tokyo, Japan

[21] Appl. No.: 61,049

[22] Filed: Jul. 26, 1979

[30] Foreign Application Priority Data

Aug. 2, 1978 [JP] Japan .................................. 53-93592
Nov. 24, 1978 [JP] Japan ............................... 53-144169
Dec. 22, 1978 [JP] Japan ............................... 53-157445
Dec. 25, 1978 [JP] Japan ............................... 53-158544
Jan. 26, 1979 [JP] Japan .................................. 54-7107

[51] Int. Cl.³ .......................... B05C 3/04; B05C 3/10
[52] U.S. Cl. ..................................... 118/58; 118/425; 118/426; 118/428; 118/429; 134/66; 134/165
[58] Field of Search ............... 118/425, 426, 423, 428, 118/58, 66, 52, 500, 429, 73, 421; 134/66, 83, 165; 354/315, 338, 339, 322

[56] References Cited
U.S. PATENT DOCUMENTS

| 3,494,326 | 2/1970 | Upton | 118/52 X |
| 3,559,554 | 2/1971 | Schmidt | 354/322 X |
| 3,882,525 | 5/1975 | Zwettler | 354/339 X |
| 4,032,943 | 6/1977 | Zwettler | 354/322 X |
| 4,098,923 | 7/1978 | Alberti et al. | 118/500 X |

Primary Examiner—John P. McIntosh
Attorney, Agent, or Firm—Craig and Antonelli

[57] ABSTRACT

A surface treatment device capable of carrying out the surface treatment such as washing or etching of plate-like articles such as semiconductor wafers maintaining high degree of reliability, wherein a surface treating liquid is introduced into a ring-like or a conduit-like treating vessel. The plate-like articles to be treated are moved by a conveyor on a conveyor path having a surface in parallel with the surfaces of the plate-like articles against the stream of the treating liquid in a piece-by-piece manner, so that the surfaces of the plate-like articles are treated, whereby the surfaces of the semiconductor wafers can be desirably treated prior to manufacturing the semiconductor products.

27 Claims, 14 Drawing Figures

SURFACE TREATMENT DEVICE

BACKGROUND OF THE INVENTION

The present invention relates to a device for treating the surface of plate-like articles, and more specifically to a device for treating the surfaces of semiconductor wafers (thin plates having circular flat planes).

In producing the semiconductor devices, the impurities or chemicals adhered on the semiconductor wafers must be washed away or foreign matters must be removed by way of etching prior to subjecting the semiconductor wafers to treatments such as photoetching, thermal oxidation and diffusion.

So far, the surface treatment for washing or etching the wafers has been performed using a surface treatment device in which a plurality of wafers are accommodated in a plurality of stages in a cartridge, and the cartridge is manually operated up and down or to and fro, such that the wafers are alternately plunged into of or taken out, a vessel containing surface treatment liquid such as washing solution or etching solution. With the device of this type, however, the wafers are subjected to different concentrations and temperatures of the surface treating liquid depending upon whether the wafers are located at the center or near the sides in the cartridge. Therefore, the surfaces are not uniformly treated, and the degree of surface treatment differs depending upon the individual wafers, causing defects to the semiconductor devices. Further, with the surface treatment by the abovementioned device, the chemicals and the washing liquid are not sufficiently stirred, giving rise to the occurrence of washing spots on the wafers and etching spots, losing uniformity and causing the quality to be degraded.

That is to say, with the surface treatment device of this type in which many wafers (for example, 25 pieces of wafers) are held by the cartridge and are subjected to the surface treatment such as washing or etching, the surfaces of the wafers tended to be nonuniformly treated depending upon the positions at which the wafers are located, or due to the stagnation of the treating liquid in the vessel, in the wafers or among the wafers. Further, when the surface treatment device of this type were to be automatically operated, the mechanism for moving the cartridge in the up and down directions or in the back and forth directions, and the handling mechanism tended to become bulky, making it difficult to continuously carry out the surface treatment.

Another conventional wafer washing system may be represented by a spinner system which sprays the washing liquid to the wafers. According to this system, the wafers can be continuously treated piece by piece. However, since the back surface of the wafer was fastened by chuck to a rotary jig of the spinner, the back surface of the wafer was not washed; therefore, both surfaces of the wafer were not simultaneously washed.

Further, in continuously treating the surfaces of the wafers by successively etching the wafers using a variety of chemical liquids, it is essential to wash the wafers with pure water before and after the etching with chemical liquids. For this purpose, a path for conveying the wafers must be provided between the etching vessel and the washing vessel, and means for conveying the wafers must be provided among the etching vessel, washing vessel and the conveying path, causing the surface treatment device to become complex in construction, requiring increased areas as well as increased installation costs.

Moreover, according to a conventional drying device for drying the wafers of which the surfaces have been treated, the cartridge for accommodating the wafers is introduced into a drying chamber, and a clean gas (such as air or nitrogen gas) is blown from the nozzles in the chamber to dry the wafers. Therefore, the conventional drying device presented the following defects. Namely, (1) the cartridge has a plurality of V-shaped grooves for accommodating the wafers. However, the surface treatment liquid tends to stay in the V-shaped grooves. Therefore, large amounts of the water must be dried requiring extended periods of time. The extended drying time can further be attributed to the fact that wide treatment chamber is necessary for batch-wise treatment needing extended periods of time for removing the moisture filled in the chamber. (2) A large cartridge revolving in the treatment chamber creates air flow. This causes the scattered water droplets to be bounced by the wall of the treatment chamber. The water droplets fly again with the air flow to adhere onto the wafers. Therefore, the cleanliness becomes nonuniform among the wafers, causing the quality to be dispersed. (3) Since the batchwise treatment method is employed, the wafers are loaded or unloaded in the treatment chamber being accommodated in the cartridge of a large size. Further, in manipulating the device, attention must be given to that the wafers are not removed from the cartridge. To automatically perform the loading and unloading, therefore, complicated and large-scale mechanism will be necessary.

SUMMARY OF THE INVENTION

The object of the present invention is to provide a surface treatment device free of the defects inherent in the abovementioned conventional art.

Another object of the present invention is to provide a surface treatment device of the type of piece-by-piece treatment, which is capable of simultaneously treating both surfaces of plate-like articles such as semiconductor wafers.

A further object of the invention is to provide a surface treatment device of a simple construction which is capable of continuously treating the surfaces of the plate-like articles one piece by one piece maintaining uniformity in the treated state.

Still another object of the present invention is to provide a surface treatment device which is capable of decreasing the percent of defective treated articles stemming from the surface treatment thereby to increase the yield.

The invention is concretely mentioned below with reference to preferred embodiments.

BRIEF DESCRIPTION OF THE DRAWINGS

The drawings show embodiments of the present invention, in which.

DESCRIPTION OF THE PREFERRED EMBODIMENTS

Embodiment I

Figure 1:
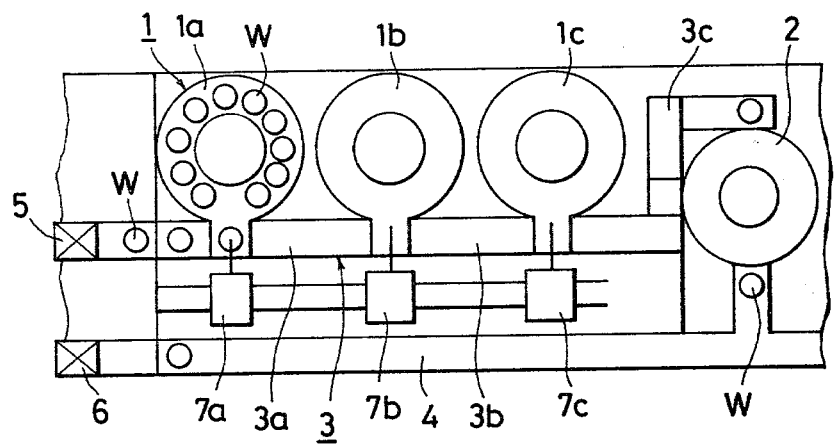
FIG. 1 is a plan view showing a whole arrangement of a continuous surface treatment device.

FIG. 1 is a front view showing a whole arrangement of a device for treating the semiconductor wafers according to an embodiment of the present invention, and a neighbouring device. In FIG. 1, an etching arrangement generally designated reference numeral 1 includes a plurality of annular etching vessels 1a, 1b, 1c for etching the wafers W, with a dryer 2 for drying the wafers W of which the surfaces have been treated. A washing arrangement generally designated reference numeral 3 includes washing vessels 3a, 3b, 3c respectively between provided the etching vessels 1a, 1b, 1c and between the etching vessel 1a, 1b, 1c and the dryer 2. The etching vessels also serve as paths for conveying the wafers. A A return path 4 is provided for returning the wafers W which have been dried and which have been subjected to other treatment steps. A loader 5 and an unloader 6 are provided with wafer-conveyor mechanisms 7a, 7b, 7c conveying the wafers between the respective etching vessel 1a, 1b, or 1c and the washing vessel 3a, 3b, or 3c on the conveyor path and on the washing vessel.

Figure 2:
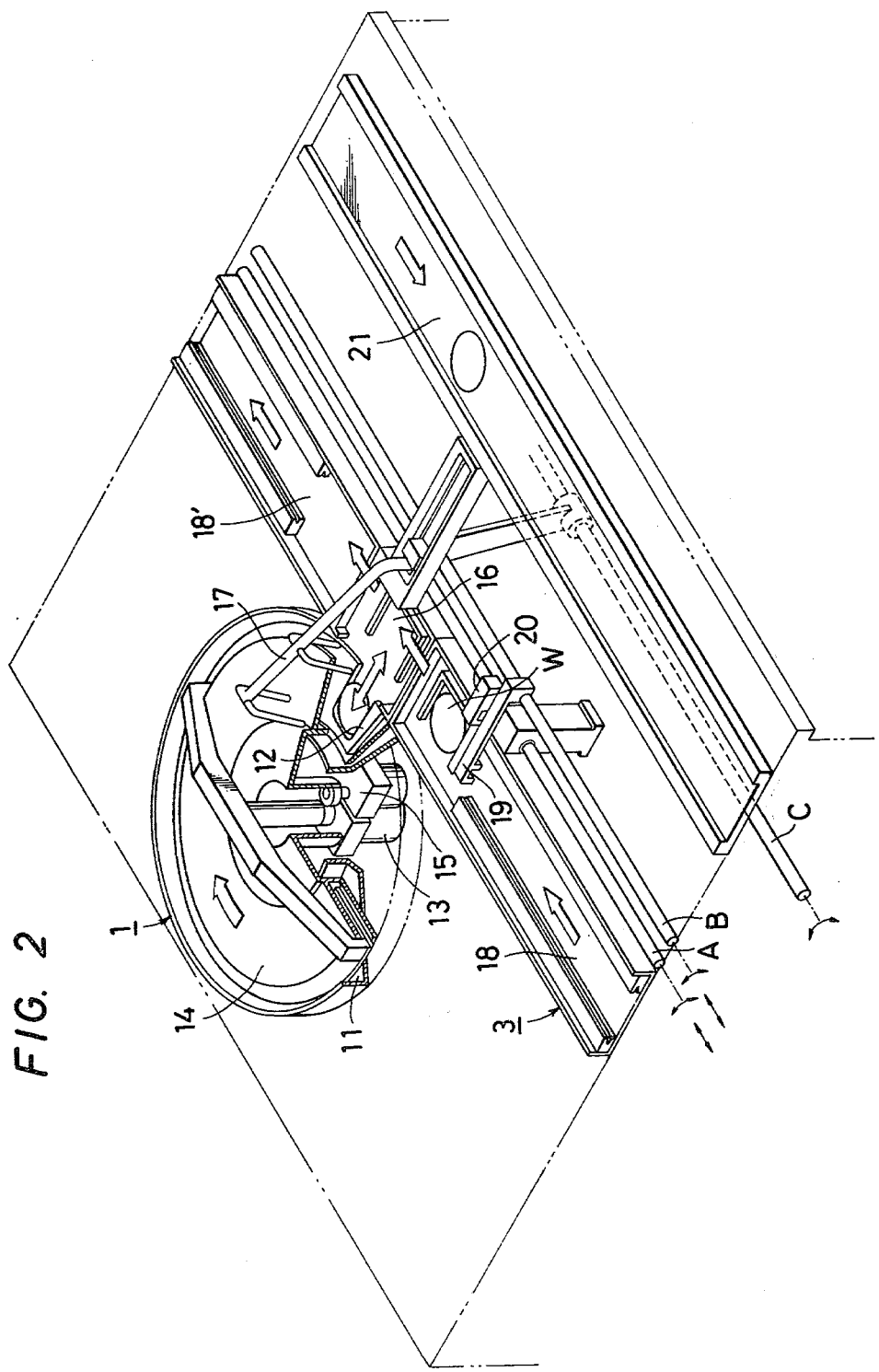
FIG. 2 is a perspective view showing a washing vessel having an etching vessel and a wafer-conveying path, and a mechanism for conveying a piece of wafer.

FIG. 2 is a perspective view showing, on an enlarged scale, the surface treatment device consisting of an etching vessel 1 and a neighbouring washing vessel 3. The etching vessel 1 includes an etching vessel body 11. A wafer holding plate 12 a motor for rotating the wafer holding plate 12, a stirrer plate 14, and a motor 15 for driving the stirrer plate 14 are provided. A spare vessel 16 is located on one side of the etching vessel body 11. The wafer W in the spare vessel 16 is sent onto the wafer holding plate 12 in the etching vessel 1 by means of a feeding pusher 17, or the washed wafer is taken out from the washing vessel 3 and is supplied into the spare vessel 16. Wafer conveyor paths 18, 18' of the washing vessel 3 are located on sides of the spare vessel 16 and extend in a direction at right angles respective to the direction in which the wafers W are transferred between the conveying paths 18, 18' and the spare vessel 16. A wafer pusher 19 sends the wafer W in the washing vessel 3 into the spare vessel 16, and a wafer conveyor 20 conveys the wafer W along the washing vessel on the conveying path. Drive shafts A, B, C move the pushers 17, 19, wafer conveyor 20 and the like. Reference numeral 21 designates a return path.

Figure 5:
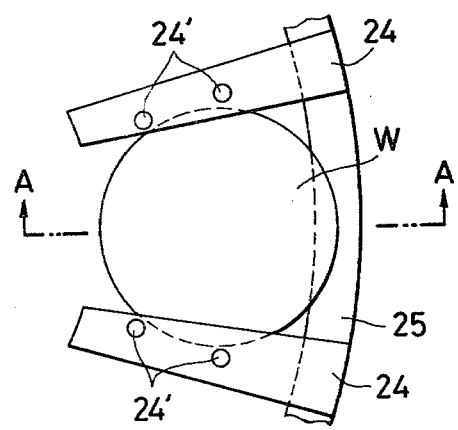
FIG. 5 is a plan view of a wafer holder.
Figure 6:
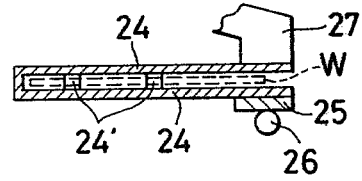
FIG. 6 is a cross-sectional view along the line A—A of FIG. 5.
Figure 3:
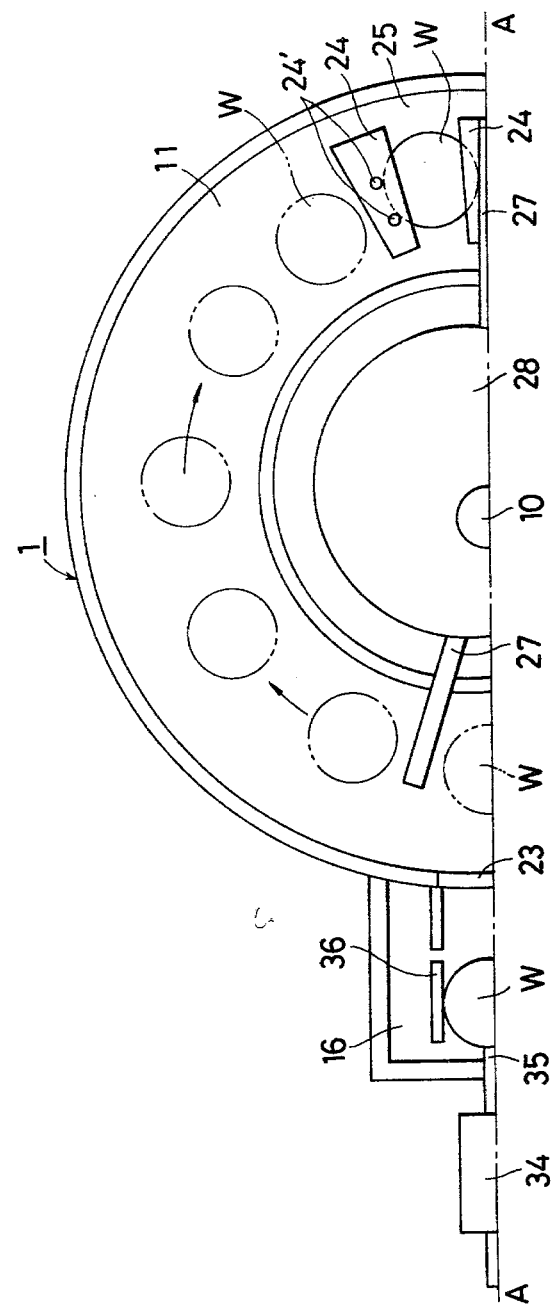
FIG. 3 is a plan view of the etching vessel.
Figure 4:
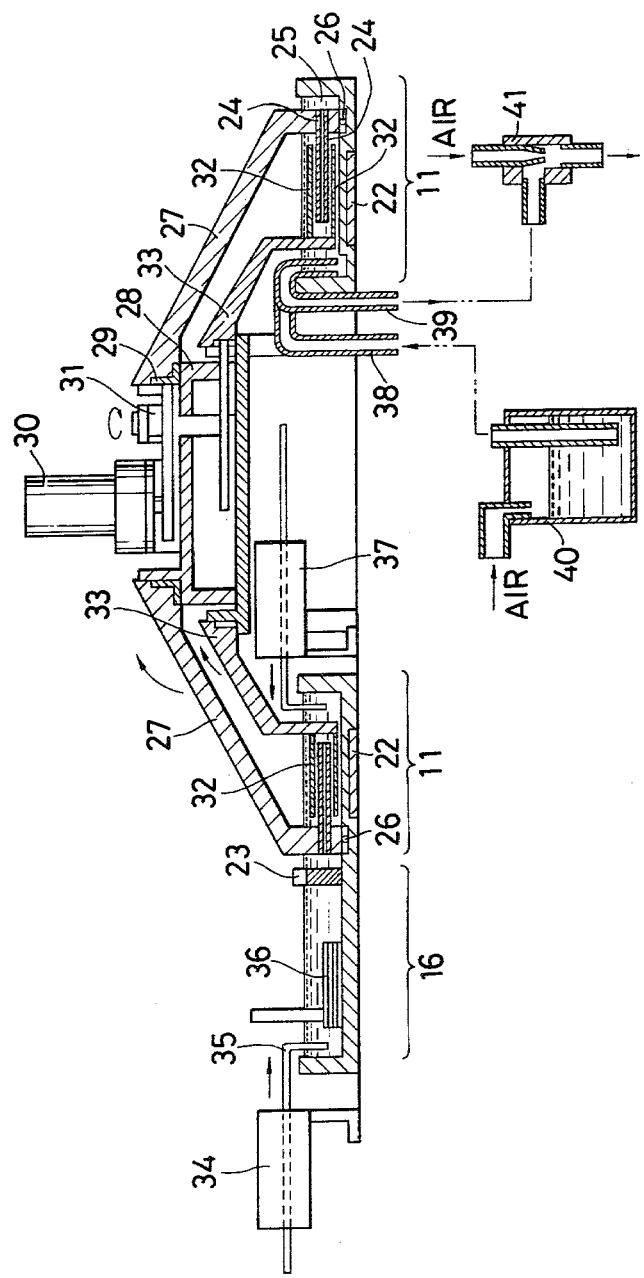
FIG. 4 is a cross-sectional view along the line A—A of FIG. 3.

FIG. 3 is a front view showing in further detail the etching vessel 1, and FIG. 4 is a cross-sectional diagram along the line A—A of FIG. 3. As shown in FIGS. 3 and 4 the etching vessel 1 consists of a ring-like vessel body 11 of a shallow bottom. An etching liquid is filled in the vessel body 11 to a predetermined level, and the wafers W are moved therein being arrayed along the circumferential direction of the vessel body 11. While being rotated once, the wafers W are etched by the etching liquid in the vessel 11. A heater 22 for heating the liquid to a required temperature has been provided beneath the bottom of the etching vessel 1. The spare vessel 16 is nearly square shaped and is located on one side of the etching vessel 1 and has a bottom level equal thereto. A boundary portion 23 has a smaller height than the etching vessel 1, such that the liquid in the etching vessel 11 flows into the spare vessel 16. The liquid in the two vessels is maintained at the same level. The spare vessel 16 temporarily stores the wafers W introduced from the external unit. The wafers W stored in the spare vessel 16 are sent into the etching vessel 1, and the wafers W treated in the etching vessel 1 are sent to the external unit via the spare vessel 16. A wafer-holder plate of two fan-shaped plates is provided which, as shown in FIGS. 5 and 6, consists 24 which are superposed. Twelve to fifteen pieces of wafers W are arrayed along the bottom of the etching vessel body 11 maintaining a predetermined distance. The wafer-holder plate is secured as a unitary structure onto a ring-like plate 25 which is in concentric with the vessel. The whole structure is allowed to rotate by means of several rotary arms 27, 33 stretching from the central portion of the ring. Reference numeral 24' denotes means for stopping the wafer, which in the drawing are stop pins. Balls 26 are interposed between the bottom surface of the ring-like plate 25 and the ring-like etching vessel body 11 so that the plate 25 will smoothly rotate. The base portion of the rotary arm 27 is mounted on a rotary circumferential wall 29 on a fixed plate 28 installed on the inner side of the ring-like etching vessel 1, and is intermittently rotated in a predetermined direction by a driving motor 30 on the fixed plate 28 via a coupling gear 31. The wafer W is inserted between the fan-shaped wafer holding plates 24, from a side direction, whereby the opposing edges of the wafer are held by the upper and lower ]-shaped and fan-shaped plates. Due to the rotational movement of the wafer-holding plates 24 rotated through the rotary arm 27, the wafers W are intermittently moved piece by; piece. A liquid stirrer plate means 32, consisting of two ring-like plates with slits or a plurality of fan-shaped plates, is supported by a rotary arm 33. The plates of the liquid stirrer plates means 32 rotate in the circumferential direction and are driven by a driving motor 30 on the fixed plate 28 through a coupling gear 31 or the like. The coupling gear 31 sets the rotating ratio of the wafer-feeding plate means 32 to the liquid stirrer plate to be, for example, 1 to 5. A wafer-feeding pusher 34 pushes, with a hooked portion 35, the wafer W held by the swing arm 36 of a spare vessel 16 in the direction of arrow (FIG. 4), such that it is fed into the etching vessel body 11 passing through the boundary portion 23 and is held between the fan-shaped plates 24. The hooked portion 35 is actuated by an air cylinder installed outside the spare vessel 16. A wafer take-out pusher 37 installed beneath the fixed plate 28 of the etching vessel 11, takes out the wafer W in the ring-like etching vessel body 11 in the reverse order to the above-mentioned order. The washing vessel having the same liquid level is connected to one side or both sides of the spare vessel as shown in FIG. 2. The wafers W are supplied into the spare vessel 16 or removed from the spare vessel 16 and introduced into the washing vessel 3 one by one by a swing arm. Each wafer W is held at both edges by the swing arm which is adapted to performs an opening and closing motion as well as a swinging motion. The swing arm is actuated by a feed mechanism which horizontally moves the arm.

A liquid-supply portion 38 and a liquid-drain portion communicate with the etching vessel body 11. As shown in a lower portion of FIG. 4, compressed air is fed into a tank 40 storing the etching liquid such that the liquid is supplied from the tank 40 through the liquid supplying portion 38. Likewise, compressed air is blown through a nozzle such that the liquid is forcibly drained by the drain.

The surfaces of the wafer W may be treated in the wafer etching vessel 1 in the following manner. (1) The wafer-holding plate 12 is at rest in the ring-like etching vessel body 11. If there is a wafer W on the wafer-holding plate 12 in a direction adjacent to the spare vessel 16, the wafer W is taken out and the pusher 17 is operated to send the wafer W into the spare vessel 16. (2) If there is no wafer W in the spare vessel 16, the feeding link is operated to feed the wafer W into the spare vessel 16 by means of a feed-link mechanism. (3) The wafer W held by the swing arm of the feed-link mechanism in the spare vessel 16 is fed by the wafer-feeding pusher 17 into the wafer-holding plate 12 of the ring-like etching vessel 1. (4) The wafer-holding plate 12 is intermittently rotated, and the liquid stirrer plate 14 is rotated. (5) The abovementioned operations (1) to (4) are repeated for every 1/12 to 1/15 turn of the wafer-holding plate 12. (6) After the wafer W has rotated once in the etching vessel 1, the pusher 17 is operated to send the wafers W one by one from the wafer-holding plate 12 into the spare vessel 16.

Figure 7:
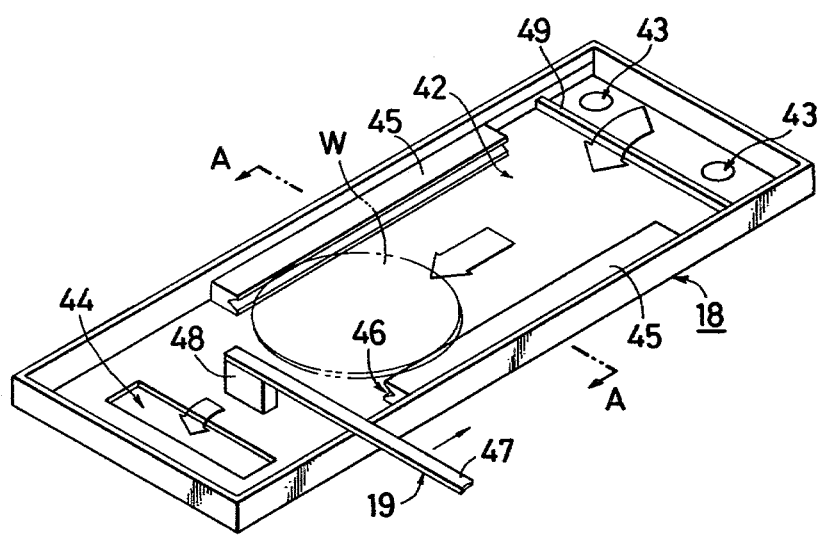
FIG. 7 is a perspective view showing the washing vessel which also serves as the wafer-conveying path.
Figure 8:
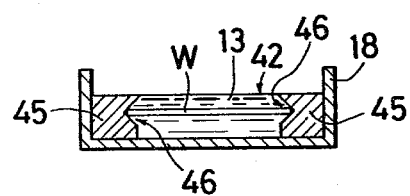
FIG. 8 is a cross-sectional view along the line A—A of FIG. 7.

As shown in FIGS. 7 and a, the wafer-conveyor path 18 of the washing vessel 3 has a slender flow path with a shallow bottom. The washing liquid (pure water) is continuously supplied from feed ports generally designated by the reference numeral 43 formed in a lower portion at one end of flow path generally designated by the reference number 42, and is drained through a drain port generally designated by the reference number 44 formed in a lower portion at the other end of the flow path 42. Wafer guides 45 are disposed in parallel with each other on both sides of the flow path 42 along the flow of the washing liquid. V-shaped grooves generally designated by the reference numeral 46 are formed in the lengthwise direction in a central portion on the opposing surfaces of the guides 45, such that edges of the wafer W moving in the flow path 42 are guided by the V-shaped grooves 46. Further, the wafer-moving mechanism or pusher 19 which moves from the downstream of the flow path 42, i.e. from the side of drain port 44, toward the upstream side of the flow path 42, i.e. toward the feed port 43, is provided on a side of the washing vessel 3. A moving piece 48 for moving the wafer W is attached to the lower surface at the tip of an arm 47 of the moving mechanism or pusher 19 so that the wafer W, guided along the V-shaped grooves 46 of the guides 45, is conveyed by the wafer-moving mechanism or pusher 19.

A weir 49 is provided near the feed port so that the washing liquid supplied from the feed port 43 into the flow path 42 will flow in the form of a stratified stream or in the form of a stream having a predetermined depth passing through the upper and lower surfaces of the wafers W.

Figure 9:
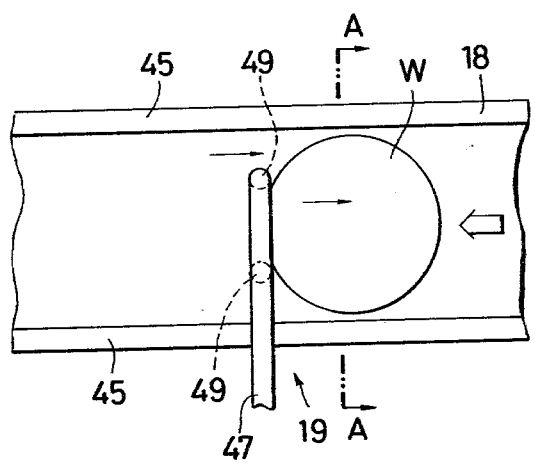
FIG. 9 is a plan view showing another form of the washing vessel.
Figure 10:
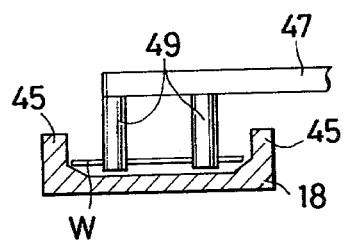
FIG. 10 is a cross-sectional view along the line A—A of FIG. 9.

With the washing vessel 3 constructed as described hereinabove, the pure water is continuously supplied into the flow path 42 and is allowed to flow in the flow path 42. After the wafers W are supplied one by one to the downstream side of the flow path 42, the moving mechanism or pusher 19 is moved toward against the flow of stream, toward the upstream side of the flow path 42. The rear end of the wafer W is pushed by the moving piece 48 and the wafer W is moved against the flow of stream while being guided by the grooves 46 so that the wafer W is washed. As a result, the pure water is always in contact with the front and back surfaces of the wafer W. Here, since the flowing speed is fast, the wafer W is effectively washed with the water while it moves along the flow path. Referring to FIGS. 9 and 10, two moving pins 49 are provided in place of the moving piece 48 on the arm 47 of the moving mechanism, so that the wafer W will not rotate while it is being conveyed.

Figure 11:
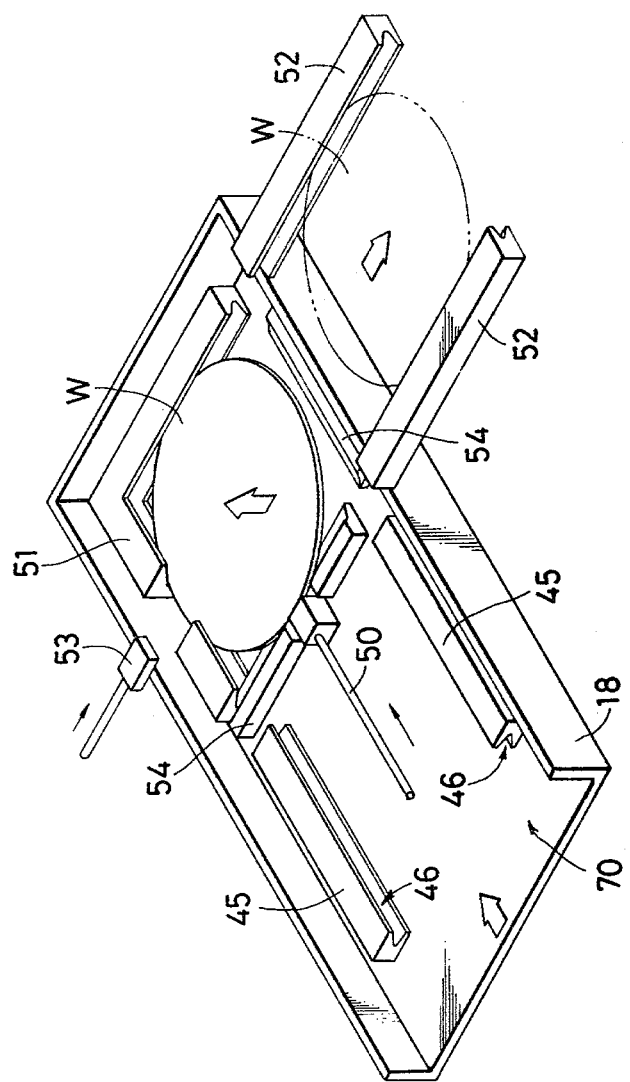
FIG. 11 is a perspective view showing a connecting portion between a washing unit and a dryer.

FIG. 11 shows a portion where a terminal of a wafer washing vessel wafer-conveyor path is connected to a path of the dryer. The wafer W guided through the grooves 46 of a pair of guides 45 and conveyed by a pusher 50 is carried onto a frame-like hoist stage 51 provided on the upstream side of the flow path 42. As the hoist stage 51 is raised, the wafer W emerges from the washing liquid and is carried in an upper direction. A pair of guides 52 are stretched from the side of the washing vessel 3 in a direction at right angles thereto. The wafers W are conveyed with their edges being guided through V-shaped grooves formed in the opposing surfaces of the guides 52. With the hoist stage 51 being at rest at its raised position, the wafer W placed thereon is transferred by a pusher 53 from the hoist stage 51 onto the guides 52 and is conveyed to a desired position. The hoist stage 51 has a frame structure with its four sides being surrounded so that the wafer will not swim in the liquid. A portion through which the wafer W enters or goes out has a placing piece 54 with a L shape cross-sectional configuration. The wafer W is allowed to move overcoming the placing piece 54.

The pushers 19 and 17 work to feed the wafers by way of a rotary motion and an axially oriented motion of three drive shafts A, B and C that are provided in parallel with the washing vessel 3 that also serves as a wafer conveyor path as shown in FIG. 1. These feeding motions are attained by a group of cams fitted to the shaft of the motor.

Figure 12:
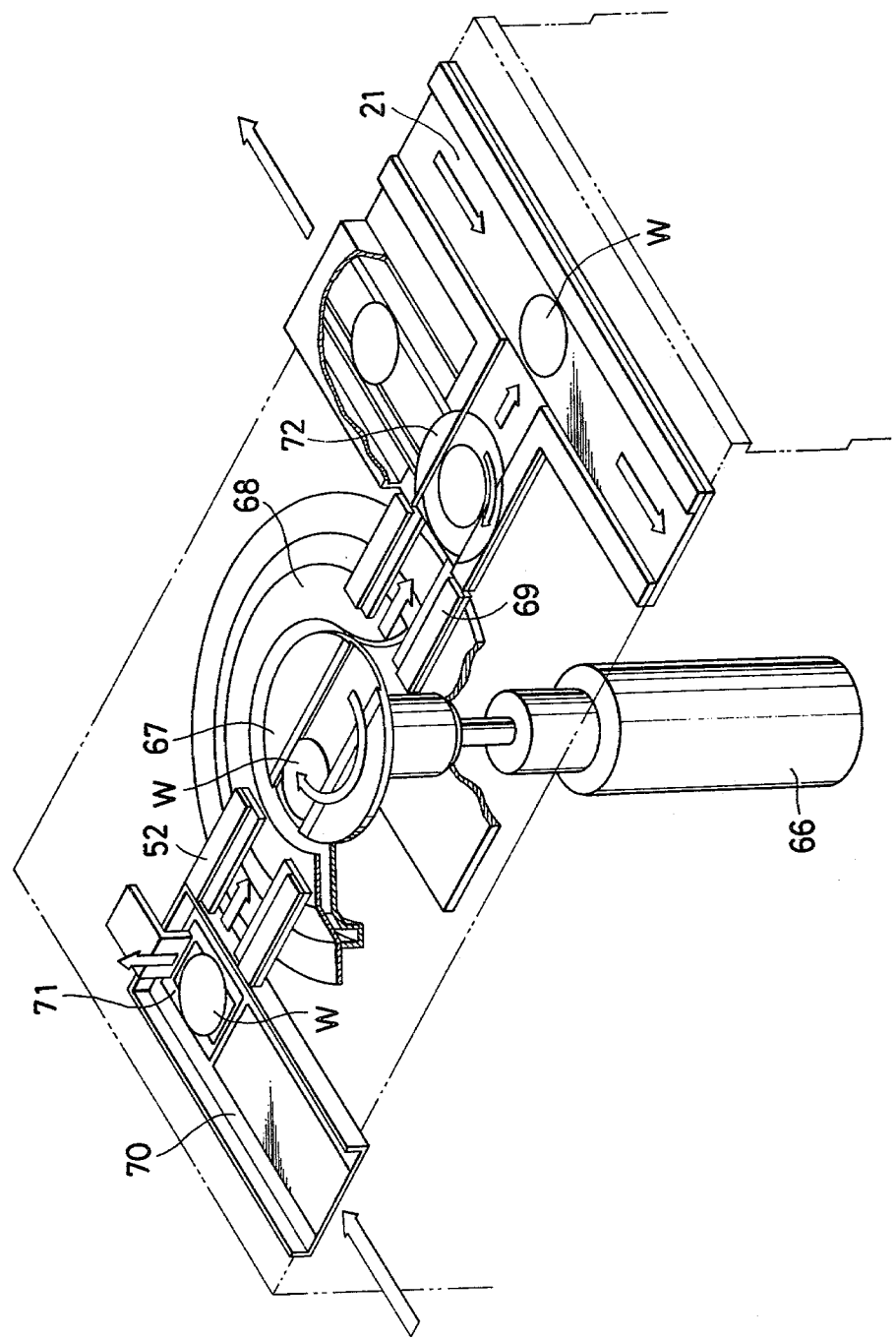
FIG. 12 is a perspective view of the dryer.

The dryer, as shown in FIG. 12, consists of a rotary table 67 rotated by a motor 66, and a dryer cup 68 having ring-like gaps formed in the circumference thereof. Wafer-moving guides 52, 69 are so provided as to sandwich the rotary table 67 in between, and dry nitrogen gas is introduced to the rotating center of the rotary table 67 and is exhausted from the dryer cup 68. The wafers W conveyed from the washing vessel 3 are introduced into a hot-water vessel 71 passing through a rinsing conveyor path 70, elevated to the height of the guides 52 by the abovementioned stage 51, and are placed onto the rotary table 67 via the guides 52. The wafers W on the rotary table 67 are dried by rotating the table 67 at a high speed and, at the same time, introducing the dry nitrogen gas. In this case, the wafers W are prevented from escaping by means of pins or the like. The dried wafers W are transferred from the table 67 to the next guides 69, and are selectively conveyed to either one of the subsequent wafer-treating unit or the return path by means of a wafer-sorting table 72.

The rotary shaft of the rotary table 67 is equipped with a sealing device which attains sealing between the rotary shaft and the receiving unit via a labyrinth packing, and which has wide space for storing water content between a groove of a lower fixed piece of the labyrinth packing and a projection of an upper moving piece which fits to the groove.

With the abovementioned non-contact sealing construction, no dust is generated. Therefore, the above sealing device is best suited for the rotary shaft of a semi-conductor manufacturing apparatus such as wafer-washing apparatus which require high degree of cleanliness. Further, since a trap for storing the water content is provided in the sealing device, the water can be prevented from flowing into the bearing portion supporting the rotary shaft if the trap is regularly cleaned. Therefore, the life of the bearing can be extended, the bearing needs be renewed less frequently, the maintenance can be simplified, and the bearing will be less worn out, giving advantage in economy.

Below is mentioned the operation for continuously treating the surfaces of the wafers.

(1) The wafers W, introduced into the washing vessel 3, are moved therein by the pusher 19, and the pure water is introduced into the washing vessel 3 in a direction opposite to the moving direction of the wafers W to effect the washing with pure water.

(2) The wafers W washed with the pure water are conveyed by the wafer conveyor 20 from the washing vessel 3 to the washing vessel or spare vessel 16 overcoming the weir between the two vessels 3, 16.

(3) The wafers in the spare vessel 16 are fed by the pusher 17 into the etching vessel 1.

(4) The thus introduced wafers W are held in a line-contact manner by the wafer holder having a wafer-holding plate 24 which rotates in the etching vessel 1, and are rotated in the etching vessel 1. The stirrer plate 14 is also rotated to effect the etching on the surfaces of the wafers W.

(5) After the etching has been completed, the wafers W are pulled out from the wafer holder 12 by the pusher, transferred to the next washing vessel via the spare vessel 16, washed with water, and are conveyed toward the dryer.

According to the present invention mentioned in the foregoing with reference to an embodiment, the objects contemplated by the invention mentioned earlier can be attained because of the reasons mentioned below.

(1) First, in the ring-like etching vessel 1, the individual wafers W are held at the edge portions thereof such that the liquid is allowed to come into sufficient contact with the front and back surfaces thereof. Since there is no obstacle such as other wafers in the vicinity of each of the wafers, the etching can be effectively performed.

(2) The individual wafers W are held by the same means and pass through the same path in the vessel 1. Hence, the individual wafers are treated always under the same conditions.

(3) Since the etching liquid is fluidized by the liquid stirrer plate 32, the concentration of the etching liquid and the temperature distribution can be uniformalized, whereby the wafers W are always subjected to the uniform etching maintaining high degree of reliability, enabling percent defective resulting from nonuniform etching liquid to be decreased.

(4) The depth of the etching vessel may be decreased to meet for the requirements of wafer thickness (for example, $t=0.5$ mm), wafer-holding plate 12, thickness of the liquid stirrer plate 32, thereby to reduce the real volume of the etching vessel 1. Therefore, the consumption of the liquid can be minimized.

(5) Because of the same reasons as mentioned in (4) above, only the wafers need be conveyed one piece by one piece without using a cartridge. Therefore, the conveyor mechanism can be simplified, enabling a plurality of vessels to be constructed in a compact size. If the effect for treating the surfaces of the individual wafers by the thus constructed etching vessel 1 is compared with that of the conventional batchwise system or piece-by-piece system, the superiority of the present invention can be recognized from the following fact that, when a silicon wafer having an $SiO_2$ film was subjected to the etching with 10% hydrofluoric acid, the dispersion in the etched quantity of the $SiO_2$ film was $3\sigma=83$ A with the earlier art, whereas it was decreased to $3\sigma=56$ A with the surface treatment vessel of the present invention.

The advantages of a washing vessel 3 which also serves as a wafer-conveyor path are as follows:

(1) The wafers W are allowed to move one by one with their edges being in contact with and guided by the guide grooves 46. Therefore, the front and back surfaces of the wafers come into contact with the washing liquid such as pure water, whereby the frictional force between the front and back surfaces of the wafers W is created by the movement of the wafers W against the stream of the liquid is not so great. Therefore, the washing is promoted. Further, since the washing liquid is always flowing, fresh and clean washing liquid is always supplied onto the front and back surfaces of the wafers W, enabling the washing to be effected maintaining high degree of cleanliness at all times.

(2) The wafers W are washed one-by-one, and can be washed to a desired degree of cleanliness simply by successively moving them by a predetermined distance in the flow path. Therefore, the washing time per wafer W can be reduced.

(3) The wafers W move one-by-one in the flow path 42 of the washing vessel 3. Therefore, the washing can be sufficiently effected even with a shallow vessel, enabling the consumption of the washing liquid to be reduced as compared with the conventional overflow system.

The effects mentioned in (1) to (3) above can be verified by the following examples. Namely, a cartridge accommodating 25 wafers is immersed in a hydrofluoric acid solution of a concentration of 10%, and is washed using a washing liquid (pure water) by means of a conventional overflow-type system. In this case, when the pure water is supplied at a rate of 3 liters per minute, the treating time of about 15 minutes is necessary until the specific resistivity of the pure water in the washing vessel becomes 14 MΩ·cm. On the other hand, when the washing is effected using the washing vessel 3 of the present invention, treating time of only about 18.5 seconds is necessary until the specific resitivity of the pure water becomes 14 MΩ·cm when the pure water is supplied at a rate of 3 liters per minute. This means that 45 liters of pure water is used to wash 25 pieces of wafers using the conventional overflow-type system, while according to the washing vessel 3 of the present invention, only about half the amount of water, i.e., 24 liters of water is required to do the same work. Further, although the treating time of 15 minutes was so far required to wash 25 wafers, the washing vessel 3 of the present invention enables the washing time to be reduced to about one-half, i.e., 7.7 minutes.

The conveyor mechanisms for conveying the wafers are actuated by a common shaft of a single drive motor via a group of cams. Accordingly, the operations of the wafer pushers, conveying of wafers between the vessels, and introduction and take-out of wafers in the etching vessel can be continuously performed to treat the wafers one-by-one, making it possible to materialize a completely automatic surface treatment apparatus, requiring a driving mechanism which is generally simplified and constructed in small size.

Figure 13:
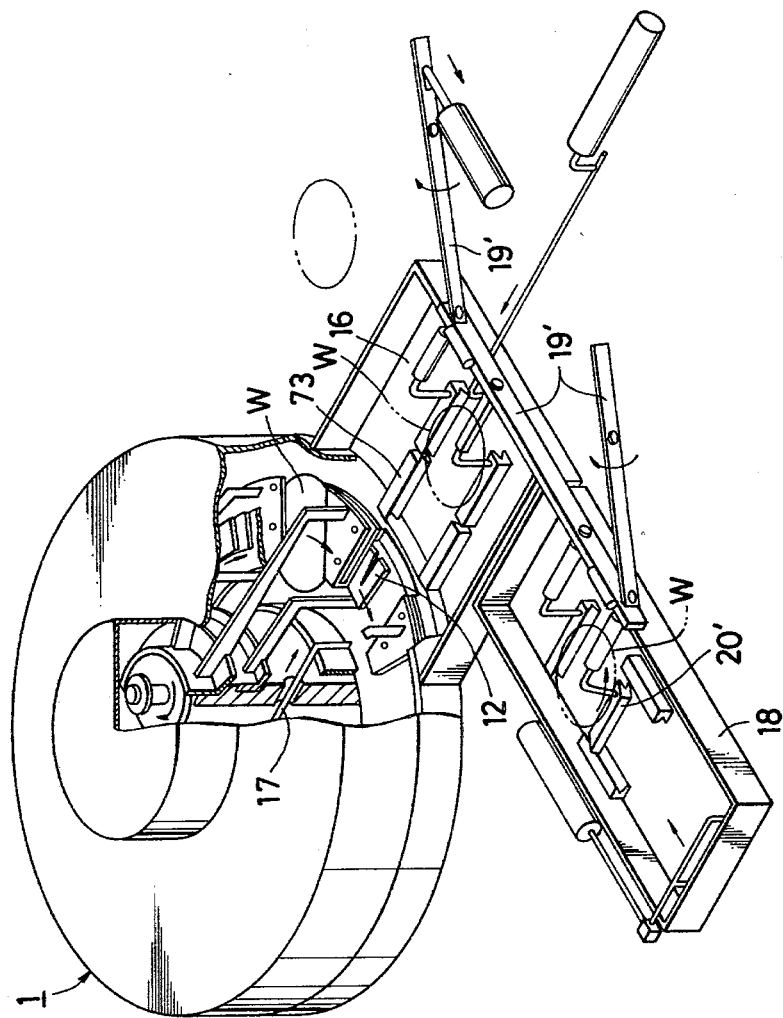
FIG. 13 is a perspective view showing another embodiment according to the present invention.

In addition to the semiconductor wafers, the invention can also be applied to the surface treatment apparatus for washing or etching all kinds of plate-like articles such as thin and flat plates. If coupled to various equipment associated with the loader/unloader, dryer, and other treating steps for treating articles such as wafers that are to be treated, the treatment can be carried out consistently. Embodiment II:

FIG. 13 is a perspective view showing a portion of the surface treatment device according to another embodiment of the present invention. The surface treatment according to this embodiment features a wafer-conveyor mechanism. Referring to FIG. 13, a washing vessel 3 is connected to one or both sides of the spare vessel 16 having the same liquid level. The wafers W are supplied into the spare vessel 16 or taken out from the spare vessel 16 and are introduced into other vessel (not shown) connected to the spare vessel 16 piece-by-piece being held at both edges by a swing arm which performs an opening and closing motion and which also swings the swing arm being actuated by a feed-link mechanism 19' which horizontally moves the arm and by a conveyor device 20' having swing arm. A wafer guide 73 is fastened to the bottom of the spare vessel 16.

The swing arm operates by an equal pitch in synchronism, for example, with the intermittent motion of the wafer-holding plate 12 in the etching vessel.

Using a surface treatment device constructed in accordance with the second embodiment of the present invention treating the surfaces of the wafers W is accomplished in the following manner.

(1) The wafers W introduced into the arm of the feed-link mechanism 19 in the washing vessel 3 are held by closing the swing arm.

(2) The wafer-holding plate 12 is at rest in the ring-like etching vessel 1. If there is a wafer W on the wafer-holding plate 12 in a direction adjacent to the spare vessel 16, the wafer W is taken out and the pusher is operated to send the wafer W into the spare vessel 16.

(3) If there is no wafer W in the spare vessel 16, the feeding link is operated to feed the wafer W into the spare vessel 16 by means of a feed-link mechanism 19.

(4) The wafer held by the swing arm of the feed-link mechanism 19 in the spare vessel 16 is fed by the wafer-feeding pusher into the wafer-holding plate 12 of the ring-like etching vessel 1.

(5) The wafer-holding plate 12 is intermittently rotated, and the liquid stirrer plate is rotated.

(6) The abovementioned operations (1) to (5) are repeated for every 1/12 to 1/15 turn of the wafer-holding plate 12.

(7) After the wafer has rotated once in the etching vessel 1, the pusher is operated to send the wafers W one-by-one from the wafer-holding plate 12 into the holder of the swing arm of the feed-link mechanism 19 in the spare vessel 16.

(8) Owing to the operation of the feed link, the wafers W are sent from the spare vessel 16 into the next station (vessel).

According to the abovementioned second embodiment of the present invention, (1) the wafers W are held at the edge portions thereof in the etching vessel 1, such that the liquid is allowed to come into sufficient contact with the front and back surfaces thereof, and further, the etching can be effectively performed since there is no obstacle such as other wafers in the vicinity of each of the wafers W; (2) the individual wafers are held by the same means and pass through the same path in the etching vessel 1, so that the individual wafers are treated always under the same conditions; (3) since the etching liquid is fluidized by the liquid stirrer plate (disk), the concentration of the etching liquid and the temperature distribution can be uniformalized, whereby the wafers are always subjected to the uniform etching maintaining high degree of reliability, enabling percent defective resulting from nonuniform etching liquid to be decreased; (4) the depth of the vessel may be decreased to meet for the requirements of wafer thickness (for example, t=0.5 mm), wafer-holding plate 12, and thickness of the liquid stirrer plate, thereby to reduce the real volume of the vessel and to minimize the consumption of the liquid; and (5) because of the same reason as mentioned in (4) above, only the wafers W need be conveyed without using a cartridge, so that the conveyor mechanism is simply constructed and the whole device is constructed in a compact size, enabling the cost for the facility to be reduced.

Further, a plurality of fan-shaped plates each consisting of a pair of upper and lower plates may be annularly arrayed maintaining a predetermined pitch to constitute the stirrer plate. In this case, the treating liquid will create turbulent flow. However, since the turbulence is created under the same condition everywhere, the surfaces of the wafers can be uniformly treated. With such a stirrer plate, the pushers have been so designed as will be able to move among the plates.

The upper and lower stirrer plates hold the wafer-holding plate 12 in between, and are supported by rotary arms and are further rotated in the circumferential direction of the ring being driven by the motor installed on the fixed plate via coupling gears. Further, the gap is made narrow between the surface of the wafer W held by the wafer-holding plate 12 and the stirrer plate, so that when the stirrer plate is rotated, the treating liquid, turned by the friction with respect to the surfaces of the stirrer plate flows, in the form of a stratified stream along the surfaces of the wafer. Further, the coupling gear has been so set that the running ratio of the wafer-feeding plate (wafer-holding mechanism) to the stirrer plate will be, for example, 1 to 5.

Figure 14:
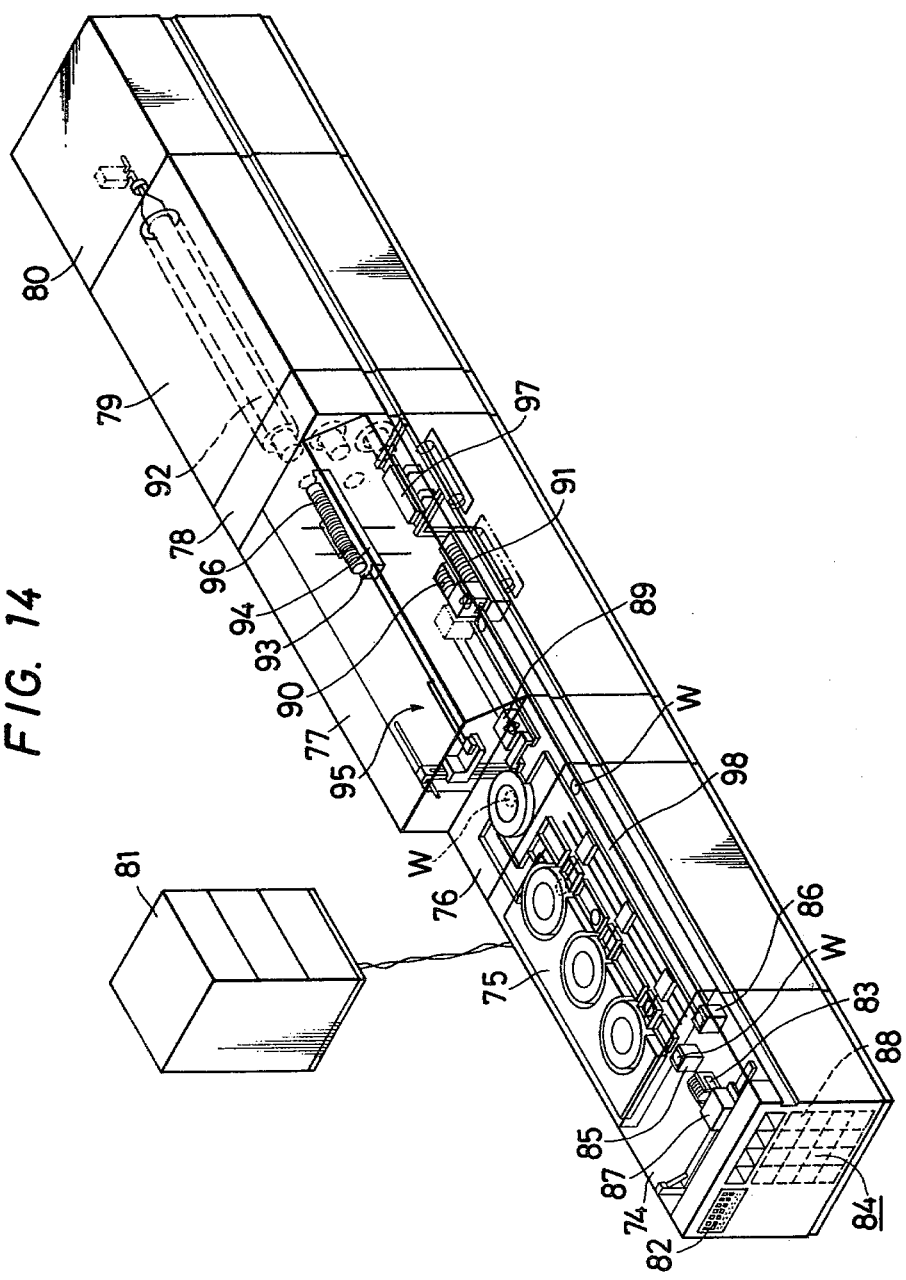
FIG. 14 is a perspective view showing a further embodiment according to the present invention.

According to the present invention mentioned by way of the foregoing embodiment, the wafers W are held at their edge portions in the ring-like etching vessel 1, whereby the etching liquid is allowed to come into sufficient contact with the surfaces of the wafers. Further, since the liquid is fluidized by the stirrer plate and the stratified stream is created on the front and back surfaces of the wafers W, the concentration of the etching liquid and the temperature distribution are uniformalized. Because of these reasons, the surfaces of the wafers W are treated always uniformly and highly reliably, making it possible to decrease the percent defective resulting from the nonuniform treating liquid. Embodiment III:

FIG. 14 is a schematic perspective view showing a third embodiment of a device for treating the surfaces of wafers according to the present invention, in which a batch loader/unloader means for the wafers is installed in the prestage, and a diffusion furnace for batch wise treating of the the wafers is installed in the subsequent stage.

The device for consistently treating the wafers shown in FIG. 14 consists of, from the left to the right, a loader/unloader 74, a surface treating device 75, a dryer 76, a wafer-conveying portion 77, a scavenger 78, a furnace 79, a diffusion furnace having a gas-feeding portion 80, and a control device 81. The control unit (control system) consists of the control device 81 and a control device 82 installed on a side of the loader/unloader 74.

The loader/unloader means consists of a stocker 84 for storing a preservation cartridge 83, a loader mechanism 85 for sending the wafers W one-by-one onto a first conveyor path, an unloader mechanism 86 for recovering the wafers W one-by-one from a final conveyor path, and a hand-over mechanism 87 which hands over the wafers W in the cartridge 83 while moving among the stocker 84, the loader mechanism 84 and the unloader mechanism 86. The stockers 84 are arrayed in a plurality of numbers in the vertical and horizontal directions and possess containers 88 into which the cartridges 83 are introduced from the outer side of the device. The hand-over mechanism 87 is located on an inner side of the container 88. The hand-over mechanism 87 consists of a conveyor mechanism which takes out a specified cartridge in the stocker 84, carries it onto a reversing table, and further moves it from the reversing table to the container, a reversing table which moves between the loader mechanism 85 and the unloader mechanism 86, a transfer pusher which transfers the wafer W in the cartridge 83 on the reversing table into a container box of the loader mechanism, and a transfer pusher which transfers the wafers W in the container box of the unloader mechanism 86 into an empty cartridge on the reversing table.

Therefore, as the cartridge 83 is fed onto a receiving plate of the reversing table by means of the conveyor mechanism, the receiving plate is turned by 90 degrees, whereby the cartridge 83 is erected (so that a groove accommodating the wafers W of the cartridge 83 is disposed in a horizontal state, and the opening of the cartridge 83 for introducing or taking out the wafers W is directed toward the loader/unloader mechanism 85, 86. When the wafers W are accommodated in the cartridge 83, the reversing table approaches the loader mechanism 85, whereby the wafers W in the cartridge 83 are transferred into the container box due to the transfer pusher which temporarily advances by the +X movement. When no wafer W is accommodated in the cartridge 83, the reversing table approaches the unloader mechanism 86 so that the wafers W in the container box are transferred into the cartridge 83 by the temporarily advanced transfer pusher according to −X movement. The wafers W are transferred between the container box and the cartridge 83 after the height of the container box is brought into agreement with the height of the cartridge.

The wafer conveyor portion 77 and the diffusion furnaces 78 to 80 are mentioned below. The wafer conveyor portion 77 has an inlet path and an outlet path. Referring to the inlet path, a receiving portion receives the wafer W one by one from a conveyor path consisting of a conveyor system based upon the pusher, which extends from a wafer-sorting table of a dryer 76 through a hot-air dryer path. An attitude correcting mechanism and an inlet buffer 90 are disposed on a right hand side of the receiving portion and on a transfer device which moves in the right and left, and in the upper and lower directions. Further, the outlet path is arrayed in front of the inlet path. An outlet buffer 91, a mechanism for sending the wafers W one by one, and an outlet table are disposed above the transfer device from the left side toward the right side, so that the wafers W can be sent one by one from the left end of the device. An elevator 94, disposed at the ports of process tubes 92 arranged in three stages, supports support a tray station 93 and moves up and down along the two erected guide rods. Further, a boat loader generally designated by the reference numeral 95 is installed on the back side of the device to move in the upper and lower directions along the guide rods in synchronism with the upper and lower motions of the elevator 94. There is further provided a carrier 97 which holds a heat-treating jig 96 on the transfer or tray station 93 and carries it onto the tray station (transfer).

The operation for treating the wafers in the above-constructed treatment device is carried out in the following manner. First, the cartridge 83 accommodating the wafers W (for example, a preservation cartridge accommodating 25 wafers) is contained in the container 88 of the stocker 84 that serves as a preservation rack. In this case, the accommodated condition of the cartridge 83 in the stocker 84, kinds of wafers accommodated in the cartridge, treating conditions, and the priority of treatment are memorized in the control system 81, 82. Here, the operator operates the operation board of the control system 81, 82, so that the wafers W are treated in the order mentioned below.

(1) As the device is operated, the wafers W in the cartridge 83 are transferred onto the loader mechanism 85 by means of the hand-over mechanism 87, and the wafers W are successively transferred from the loader mechanism 85 to the washing vessel in the surface treatment device 75 via the conveyor path.

(2) The wafers W which have moved in the washing vessel that serves as a conveyor path against the stream of pure water while being washed, are introduced into the spare vessel located in front of the etching vessel (treating vessel), and are introduced into the treating vessel by the inlet/outlet pusher. The wafers W introduced into the treating vessel move in the etching liquid in an annular manner in the treating vessel, and return to the initial position, and are sent back to the spare vessel by the return operation of the inlet/outlet pusher. Thereafter, the wafers are conveyed from the spare vessel to the next etching vessel via the washing vessel that also serves as an outlet path, and are subjected to the etching again. Thus, the wafers are treated by each of the etching vessels and are sent to the dryer passing through the washing vessel which also serves as an outlet path.

(3) In the dryer, the wafers W held by the rotary table are dried while being rotated, and are then sent to the wafer-sorting table. So long as the wafers have not been commanded to be transferred to the unloader mechanism by the wafer-sorting table, the wafers are transferred to the conveyor path leading to the wafer inlet/outlet portion, and are introduced into the wafer inlet/outlet portion via the hot-air drying furnace.

(4) The wafers W transferred to the wafer inlet/outlet portion are oriented to be flat and are trimmed in a predetermined direction with respect to the main surface for forming circuit pattern by means of the attitude correcting mechanism 89, and are successively introduced into the inlet buffer 90. As a predetermined pieces (for example, 100 pieces) of wafers W are accommodated in the inlet 90 buffer, the wafers are then treated as a batch. The wafers in the inlet buffer 90 are transferred to a heat-treatment jig 96. The heat-treatment jig 96 is carried by the transfer and the carrier 97 onto a boat of the tray station 93 on the elevator 94, conveyed to a specified furnace port by the elevator 94, and inserted into the process tube 92 by a boat loader 95. After the heat-treatment jig 96 is accommodated in the process tube 92, the furnace port is closed by a shutter mechanism, and the wafers W on the heat-treatment jig 96 are subjected to the heat treatment such as diffusion.

(5) After the wafers W are treated with heat, the heat-treatment jig 96 in the process tube 92 is carried to the transfer located on the outlet side by the interlocked operations of boat loader 95, elevator 94 and carrier 97. Thereafter, the wafers accommodated in the heat-treatment jig 96 on the transfer are simultaneously transferred in a number of 100 pieces into the outlet buffer. Then, the wafers W in the outlet buffer are sent one-by-one into the conveyor path 98 by means of the sending mechanism. The wafers W sent onto the conveyor path move along the conveyor path and are successively accommodated in the container box of the unloader mechanism 86. When the container box of the unloader mechanism 86 is filled with the wafers W, the hand-over mechanism 87 is operated again to transfer 25 pieces of wafers W held by the unloader mechanism 86 into an empty cartridge 83. The cartridge 83 filled with the wafers W is accommodated in an empty container 88 in the stocker 84 to perform a series of wafer treating operations. A plurality of process tubes 92 and etching vessels enable the abovementioned operations to be efficiently carried out. Here, the process tubes 92 provided in a number of at least three are always effectively utilized.

According to the thus constucted device, the following effects can be exhibited.

(1) Each of the operations is automatically performed. The whole device is covered with a covering, and space where the wafers pass is always filled with clean air. Therefore, since no operator who may be the source of dust is present in space of treatment operation, the wafers are very less contaminated making it possible to prevent the quality from being degraded.

(2) Prior to the treatment with heat, the wafers are individually treated. Therefore, the wafers are cleaned in good degree and uniformly, and are then subjected to the treatment with heat. Accordingly, the quality is high and the yield is increased.

(3) Each of the operations is automatically performed, enabling the number of workers to be reduced. Besides, the breakage of wafers caused by erroneous handling of the operators can be prevented. Particularly, the wafers which need not be conveyed among each of the devices present a great advantage.

(4) Each of the devices is controlled under optimum conditions by a control unit such as microcomputer, whereby the operations are efficiently carried out, and the cost for treating the wafers can be reduced.

As mentioned above, the present invention deals with a surface treatment device which performs the surface treatment such as washing and etching of plate-like articles such as semiconductor wafers in a piece-by-piece manner. A plurality of different surface treatments such as washing and etching will often by continuously carried out requiring dissimilar treating times. Therefore, to deal, for example, with etching which will require longer treating time than the washing, the etching vessel is formed in an annular shape instead of linear shape to reduce the required space. Therefore, the device can be constructed in a compact size, needing a simplified mechanism for conveying articles to be treated, enabling the amount of the treating liquid to be reduced and establishing uniform treating conditions even in the etching treatment which is carried out in a complicated manner as compared with the washing treatment.

When the washing treatment and the etching treatment are performed in match with each other in regard to the treating time, or when only the etching treatment is to be performed, or when only the washing treatment is to be performed under the same treatment conditions, the treatment vessels of the device of the present invention need not be formed in an annular shape but may be formed in the shape of trough. Further, the surface treatment device of the present invention can be embodied in a variety of forms so far as it does not depart from the spirit of the invention, i.e., the plate-like articles are treated piece-by-piece.

Since the fundamental idea of the present invention is to treat the articles piece-by-piece, the articles can be uniformly treated. In other words, the articles can be immersed in the treating liquid under the same conditions enabling them to be uniformly treated irrespective of the places in the treatment vessel or irrespective of the locations of the articles with respect to each other, making it possible to automatically and continuously perform the treatment using reduced amounts of treating liquids. Furthermore, the device of the present invention can be used to highly reliably treat the surfaces of the wafers, such as photo etching, oxidation, CVD, vapor growth deposition, diffusion of impurities and the like, which are usually performed for manufacturing the semiconductor products, thereby making it possible to obtain semiconductor products with high performance.

What is claimed is:

1. A surface treatment device comprising at least one treatment vessel means containing a treatment liqud for treating the surfaces of plate-like articles, means for causing the treatment liquid to flow from one end portion of the treatment vessel to a second end portion of the treatment vessel, and a conveyor means for conveying the plate-like articles in said treatment liquid in a direction opposite to a flow direction of the treatment liquid along a conveyor path which is nearly in parallel with main surfaces of the plate-like articles, wherein the surfaces of said plate-like articles are treated while being conveyed in the treatment liquid in the treatment vessel by said conveyor means.

2. A surface treatment device according to claim 1, wherein said treatment vessel means is so formed that the conveyor path for conveying the plate-like articles is of a linear shape.

3. A surface treatment device according to claim 1, wherein said treatment vessel means is so formed that a portion of the conveyor path for conveying the plate-like articles is of an annular shape.

4. A surface treatment device according to claim 1 or 2, wherein the treatment vessel means consists of a treatment vessel containing a treatment liquid for washing the surfaces of the plate-like articles, and a treatment vessel containing an etching liquid for etching the surfaces of the plate-like articles.

5. A surface treatment device according to claim 1, further comprising a dryer means disposed downstream of the treatment vessel means for drying the plate-like articles, the dryer includes a rotary member having a container accommodating the plate-like articles.

6. A surface treatment device according to claim 5, wherein the container of said rotary member only accommodates one plate-like article conveyed from the treatment vessel, and in that said plate-like article is dried by rotation of the rotary member.

7. A surface treatment device according to one of claims 1 or 5, wherein means are provided in a prestage of the surface treatment device for taking out the plate-like articles one by one from a cartridge accommodating a plurality of said plate-like articles and for supplying said plate-like articles to said surface treatment device, and means are provided in a post-stage of said surface-treatment device for subjecting the surface-treated plate-like articles to another treatment by using a jig capable of accommodating a plurality of said plate-like articles.

8. A surface treatment device according to claim 7, wherein a holder mechanism is provided for holding the plate-like articles in the treatment liquid, and a stirrer member is disposed adjacent to the surfaces of said plate-like articles held by said holding mechanism, said stirrer member being adapted to move in a sliding manner relative to the surfaces of said plate-like articles.

9. A surface treatment device according to claim 1, characterized in that a plurality of treatment vessel means are provided, said treatment vessel means including a plurality of vessels containing washing liquid and a plurality of vessels containing a etching liquid, one of the vessels containing the washing liquid is disposed at least between adjacent vessels containing the etching liquid, a spare vessel is associated with each vessel containing the etching liquid, and in that means are provided at each spare vessel and vessel containing the etching liquid for transferring articles from the spare vessel into an associated vessel containing the etching liquid and from a vessel containing the etching liquid into the spare vessel.

10. A surface treatment device according to claim 9, characterized in that means are provided in each vessel containing the etching solution for holding the individual articles in a spaced relationship from each other, and in that means are provided for intermittently moving the holding means so as to accommodate a plurality of articles in the vessel containing the etching liquid.

11. A surface treatment device according to claim 10, characterized in that the holding means is a plate member disposed in the vessel containing the etching liquid.

12. A surface treatment device according to claim 10, characterized in that the holding means includes a plurality of fan-shaped plate members respectively spaced from each other by a distance sufficient to accommodate a single article.

13. A surface treatment device according to claim 12, characterized in that means are provided on the respective fan-shaped plate members for stopping the respective articles.

14. A surface treatment device according to claim 13, characterized in that the fan-shaped plate members are disposed in superposed pairs.

15. A surface treatment device according to one of claims 11, 12, 13, or 14, characterized in that means are provided in each of the vessels containing the etching liquid for storing the liquid.

16. A surface treatment device according to claim 15, characterized in that stirring means includes a plurality of stirring plate members, and in that means are provided for supporting said stirring plate members for rotational movement in the vessel containing the etching liquid.

17. A surface treatment device according to claim 16, characterized in that the stirring plate members are formed as two ring-like plate members provided with a plurality of slits.

18. A surface treatment device according to claim 16, characterized in that the stirring plate members are formed as fan-shaped plates.

19. A surface treatment device according to one of claims 9 or 10, characterized in that the conveyor means includes an article moving means provided in each of the vessels containing a washing liquid, and in that guide means are provided in each of the washing vessels for guiding the articles therethrough.

20. A surface treatment device according to claim 19, characterized in that the article moving means includes an arm having at least one article moving member arranged at a free end thereof.

21. A surface treatment device according to claim 19, characterized in that the article moving means includes an arm having at least a pair of pins arranged at an underside thereof for engagement with the respective articles.

22. A surface treatment device according to claim 19, characterized in that a vessel containing the washing liquid is disposed upstream of the first vessel containing the etching liquid and downstream of the last vessel containing the etching liquid, an article dryer means for drying the articles is disposed downstream of the last vessel containing the etching liquid and is adapted to receive the articles from the vessel containing the washing liquid disposed downstream of the last vessel containing the etching liquid.

23. A surface treatment device according to claim 22, characterized in that means are provided for transferring the individual articles from the vessel containing the washing liquid to the drying means.

24. A surface treatment device according to claim 23, characterized in that the transferring means includes a frame-like hoist means for receiving the individual articles and for elevating the articles to a second level, a first pusher means for moving the article from the vessel containing the washing liquid to the hoist means, and a second pusher means for moving the article from the hoist means toward the drying means.

25. A surface treatment device according to claim 24, characterized in that a guide means is interposed between the hoist means and the drying means for guiding the individual articles into the drying means.

26. A surface treatment device according to claim 25, characterized in that the drying means includes a rotary table means for accommodating the individual articles and a dryer cup surrounding the rotary table means.

27. A surface treatment device according to one of claims 1, 2, 3, 5, or 6, characterized in that a holder mechanism is provided for holding the plate-like articles in the treatment liquid, and a stirrer member is disposed adjacent to the surfaces of said plate-like articles held by said holding mechanism, said stirrer member being adapted to move in a sliding manner relative to the surfaces of said plate-like articles.

* * * * *